US010236660B2

(12) United States Patent
Nakajima et al.

(10) Patent No.: US 10,236,660 B2
(45) Date of Patent: Mar. 19, 2019

(54) SUBMOUNT, OPTICAL TRANSMITTER MODULE, OPTICAL MODULE, OPTICAL TRANSMISSION EQUIPMENT, AND CONTROL METHOD THEREFOR

(71) Applicant: Oclaro Japan, Inc., Sagamihara, Kanagawa (JP)

(72) Inventors: Takayuki Nakajima, Tokyo (JP); Kazuhiko Naoe, Kanagawa (JP)

(73) Assignee: Oclaro Japan, Inc., Kanagawa (JP)

(*) Notice: Subject to any disclaimer, the term of this patent is extended or adjusted under 35 U.S.C. 154(b) by 0 days.

(21) Appl. No.: 15/926,152

(22) Filed: Mar. 20, 2018

(65) Prior Publication Data
US 2018/0278020 A1 Sep. 27, 2018

(30) Foreign Application Priority Data

Mar. 22, 2017 (JP) .................... 2017-056180

(51) Int. Cl.
*H01S 3/13* (2006.01)
*H01S 5/022* (2006.01)
*H01S 5/0687* (2006.01)
*H01S 5/06* (2006.01)
*H01S 5/0683* (2006.01)
*H01S 5/024* (2006.01)
*H01S 5/40* (2006.01)

(52) U.S. Cl.
CPC ...... *H01S 5/02236* (2013.01); *H01S 5/02252* (2013.01); *H01S 5/02268* (2013.01); *H01S 5/02288* (2013.01); *H01S 5/02453* (2013.01); *H01S 5/0612* (2013.01); *H01S 5/0687* (2013.01); *H01S 5/06837* (2013.01); *H01S 5/4025* (2013.01); *H01S 5/4087* (2013.01)

(58) Field of Classification Search
CPC ............... H01S 5/0687; H01S 5/02252; H01S 5/02288; H01S 5/02453; H01S 5/0612; H01S 5/06837; H01S 5/02268; H01S 5/02236; H01S 5/4025; H01S 5/4087
See application file for complete search history.

(56) References Cited

U.S. PATENT DOCUMENTS 5,140,607 A * 8/1992 Paiva .................... H01S 3/0606
                                                    372/70
7,223,617 B2 * 5/2007 Mochida ............. H01S 5/02272
                                                    257/E33.056

(Continued)

FOREIGN PATENT DOCUMENTS

JP  2001-094200 A  4/2001
JP  2007-180378 A  7/2007

*Primary Examiner* — Kinam Park
(74) *Attorney, Agent, or Firm* — Mattingly & Malur, PC

(57) ABSTRACT

A submount which has a mounting surface on which three or more semiconductor lasers are arranged in a first direction, and includes a heat generator configured to increase the temperatures of the three or more semiconductor lasers, in which, where the heat generator generates heat, a first heat of the heat absorbed by a first semiconductor laser of the three or more semiconductor lasers disposed at one end along the first direction is larger than a second heat of the heat absorbed by a second semiconductor laser of the three or more semiconductor lasers disposed to be adjacent to the first semiconductor laser on the mounting surface.

16 Claims, 15 Drawing Sheets

(56) References Cited

U.S. PATENT DOCUMENTS

| | | | | |
|---|---|---|---|---|
| 2001/0024462 A1* | 9/2001 | Nakahara | ............ | H01S 5/02252 |
| | | | | 372/43.01 |
| 2007/0242712 A1* | 10/2007 | Funada | ............... | H01S 5/02453 |
| | | | | 372/36 |
| 2010/0080567 A1* | 4/2010 | McColloch | .......... | G02B 6/4246 |
| | | | | 398/135 |
| 2017/0264075 A1* | 9/2017 | Kuramoto | ............ | H01S 5/02469 |

* cited by examiner

SUBMOUNT, OPTICAL TRANSMITTER MODULE, OPTICAL MODULE, OPTICAL TRANSMISSION EQUIPMENT, AND CONTROL METHOD THEREFOR

CROSS-REFERENCE TO RELATED APPLICATION

The present application claims priority from Japanese application JP 2017-056180, filed on Mar. 22, 2017, the content of which is hereby incorporated by reference into this application.

BACKGROUND OF THE INVENTION

1. Field of the Invention

The present invention relates to a submount, an optical transmitter module, an optical module, an optical transmission equipment, and a method for controlling the same, and particularly to a structure of a submount which can be driven in a wide operation temperature range.

2. Description of the Related Art

A submount is generally used on which a plurality of semiconductor lasers is mounted. Such a submount is used in, for example, an optical transmitter module. Compared with a discrete type optical transmitter module in which a single semiconductor laser is mounted on a single submount, the optical transmitter module in which the plurality of semiconductor lasers is integrated on a single submount hybridly has been recently used to realize miniaturization of the optical transmitter module.

SUMMARY OF THE INVENTION

In recent years, it has been desirable that the plurality of semiconductor lasers mounted on a submount is driven in a wider operation temperature range. However, the present inventors have found that the wider operation temperature range would cause the following problems as a result of intensive study of the plurality of semiconductor lasers mounted on the submount.

A first problem is that an output wavelength of each semiconductor laser highly depends on operation temperature of the semiconductor laser. It is undesirable to cause a change in an output wavelength of each semiconductor laser due to a temperature change of each semiconductor laser. Particularly, where laser light beams with different output wavelengths are multiplexed by using a plurality of semiconductor lasers, it is necessary to control an output wavelength of each semiconductor laser within a restricted range.

A second problem is that optical output efficiency and radio frequency (RF) characteristics of each semiconductor laser highly depend on the operating temperature of the semiconductor laser. It is necessary to control a drive current which flows through each semiconductor laser in order to make an optical output of emitted laser light constant even if the temperature of each semiconductor laser changes depending on an ambient temperature. In this case, particularly, at low temperature, the optical output efficiency of a semiconductor laser is increased more than at high temperature, so that the drive current flowing through the semiconductor laser is reduced, and thus radio frequency (RF) characteristics considerably deteriorate. Preferably, each semiconductor laser has desired RF characteristics in a wide temperature range, but realization thereof is not easy.

JP2001-094200A discloses that "a heater is disposed between a submount and a semiconductor laser such that the temperature of the semiconductor laser is increased, and thus the temperature of the semiconductor laser is maintained to be higher than the room temperature" (refer to Abstract). An amount of current flowing through a heat generator is controlled according to a change in an ambient temperature. Consequently, the semiconductor laser is controlled to be maintained at a predetermined temperature or higher at all times, and thus a degree of change of an output wavelength is reduced. JP2007-180378A discloses that "where a current flows through a heat generator on a surface (of a heat sink) on which a laser is mounted, the heat generator generates heat so as to heat the semiconductor laser; consequently, particularly when a laser module is operated at low temperature, the temperature of the semiconductor laser can be increased, and thus operation characteristics thereof can be improved".

In order to solve the first and second problems, it is necessary to restrict each output wavelength range of the plurality of semiconductor lasers even if an ambient temperature changes. In other words, it is necessary to provide a heat generator for increasing the temperature of each semiconductor laser at low temperature on a submount. However, there is no sufficient region for disposing other components due to wirings for driving the plurality of semiconductor lasers in a submount in which the plurality of semiconductor lasers are integrated hybridly, thus is hard to separately mount heat generators to increase the temperatures of the respective semiconductor lasers on the submount. Since a plurality of wires for driving the respective heat generators is necessary, and the same number of drive circuits as that of the heat generator is necessary, cost is increased. Where the temperature of a submount on which the plurality of semiconductor lasers is integrated hybridly is controlled by using a single Peltier element (heat generator), the present inventors have found that a significant temperature distribution occurs in the submount, and thus the temperatures of the plurality of semiconductor lasers are not uniform.

The present invention has been made in light of the problems, and an object of the present invention to provide a submount, an optical transmitter module, an optical module, an optical transmission equipment, and a method for controlling the same, capable of realizing low cost and miniaturization of the same, and reducing changes in optical characteristics of each semiconductor laser within an operation temperature range.

(1) In order to solve the first and second problems, according to the present invention, there is provided a submount which has a mounting surface on which three or more semiconductor lasers including a first semiconductor laser and a second semiconductor laser are arranged in a first direction, the submount comprising: a heat generator configured to increase the temperatures of the three or more semiconductor lasers, in which, where the heat generator generates heat, a first heat of the heat absorbed by the first semiconductor laser disposed at one end along the first direction is larger than a second heat of the heat absorbed by the second semiconductor laser disposed to be adjacent to the first semiconductor laser on the mounting surface.

(2) In the submount according to (1), where the mounting surface is divided by a perpendicular bisector of a gap between two adjacent semiconductor lasers of the three or more semiconductor lasers perpendicular to the first direction, and, in a plan view, the mounting surface comprises a first region including the first semiconductor laser and a second region including the second semiconductor laser, when the heat generator generates heat, a heat of a first heat generation portion of the heat generator disposed in the first region may be greater than a heat of a second heat generation portion of the heat generator disposed in the second region.

(3) In the submount according to (2), the first heat generation portion and the second heat generation portion may be connected in series to each other, and the heat generator may be driven by a single external power source.

(4) In the submount according to any one of (1) to (3), each of the first region and the second region may comprise a thick plate portion and a thin plate portion thinner than the thick plate portion, and a primary heat generation portion of the first heat generation portion may face a side of the first semiconductor laser on the one end side along the first direction in the first region.

(5) In the submount according to (4), the heat generator may be disposed on the thin plate portion of the mounting surface.

(6) In the submount according to (4) or (5), the first semiconductor laser may be disposed on the thick plate portion of the mounting surface.

(7) In the submount according to any one of (4) to (6), the three or more semiconductor lasers may be disposed on the thick plate portion of the mounting surface.

(8) In the submount according to (4) or (5), the first region may comprise a thick plate portion and a thin plate portion thinner than the thick plate portion, and the first semiconductor laser may be disposed in the thin plate portion of the first region.

(9) In the submount according to any one of (1) to (3), a primary heat generation portion of the first heat generation portion may be disposed under the first semiconductor laser in the first region.

(10) In the submount according to (9), a primary heat generation portion of the second heat generation portion may be disposed under the second semiconductor laser in the second region.

(11) In the submount according to (4) or (5), an area of the thin plate portion of the first region may be larger than an area of the thin plate portion of the second region.

(12) In the submount according to any one of (2) to (5), an amount of heat dissipation to an external environment from the first heat generation portion may be smaller than an amount of heat dissipation to the external environment from the second heat generation portion.

(13) According to the present invention, there is provided an optical transmitter module including the submount according to any one of (1) to (12); and the three or more semiconductor lasers.

(14) According to the present invention, there is provided an optical module including the optical transmitter module according to the above (13); and an optical receiver module.

(15) According to the present invention, there is provided an optical transmission equipment mounted with the optical module according to (14).

(16) According to the present invention, there is provided a method for controlling a submount which has a mounting surface on which three or more semiconductor lasers are arranged in a first direction, and includes a heat generator configured to increase the temperatures of the three or more semiconductor lasers, the control method including causing a current with magnitude corresponding to an ambient temperature to flow through the heat generator where the ambient temperature is equal to or lower than a first temperature; and causing a current not to flow through the heat generator where the ambient temperature is higher than the first temperature, in which, where the heat generator generates heat, a first heat of the heat absorbed by a first semiconductor laser of the three or more semiconductor lasers disposed at one end along the first direction is larger than a second heat of the heat absorbed by a second semiconductor laser of the three or more semiconductor lasers disposed to be adjacent to the first semiconductor laser on the mounting surface.

According to the present invention, it is possible to provide a submount, an optical transmitter module, an optical module, an optical transmission equipment, and a method for controlling the same, capable of realizing low cost and miniaturization, and reducing changes in optical characteristics of a semiconductor laser within an operation temperature range.

DETAILED DESCRIPTION OF THE INVENTION

Figure 1:
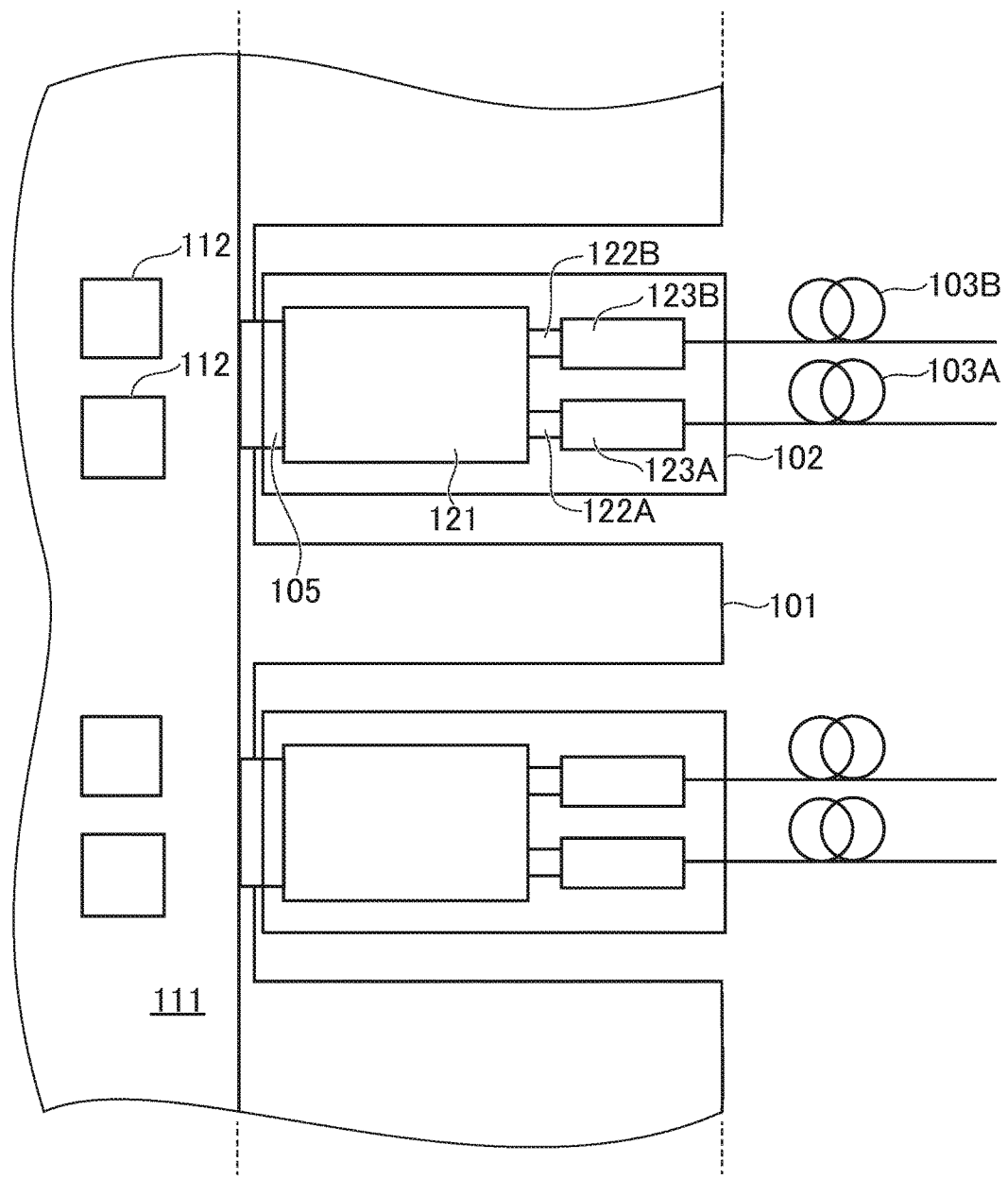
FIG. 1 is a schematic diagram illustrating an optical transmission equipment and an optical module according to a first embodiment of the present invention.

Hereinafter, embodiments of the present invention will be described in detail with reference to the drawings. A member having the same configuration is given the same reference numeral throughout the drawings for explaining the embodiments, and a repeated description will not be made. The following drawings are used to merely describe Examples of the embodiments, and a size of each of the drawings does not necessarily match a scale described in the Example.

First Embodiment

FIG. 1 is a schematic diagram illustrating an optical transmission equipment 101 and an optical module 102 according to a first embodiment of the present invention. The optical transmission equipment 101 includes a printed circuit board 111 and ICs 112. The optical transmission equipment 101 is, for example, a large scale router or switch. The optical transmission equipment 101 functions as, for example, a switch, and is disposed in a base station or the like. The optical transmission equipment 101 is mounted with a plurality of optical modules 102, acquires reception data (reception electrical signal) from the optical module 102, determines what kind of data is to be transmitted to any one of the optical modules by using the ICs 112 or the like, generates transmission data (transmission electrical signal), and delivers the data to the corresponding optical module 102 via the printed circuit board 111.

The optical module 102 is a transceiver having a transmission function and a reception function. The optical module 102 includes a printed circuit board 121, an optical receiver module 123A which receives an input optical signal via an optical fiber 103A and then converts the input optical signal into an electrical signal, and an optical transmitter module 123B which converts the electrical signal into an output optical signal which is then transmitted to an optical fiber 103B. The printed circuit board 121, and the optical receiver module 123A and the optical transmitter module 123B are connected to each other via flexible printed circuit boards 122A and 122B, respectively. An electrical signal from the optical receiver module 123A is transmitted to the printed circuit board 121 via the flexible printed circuit board 122A, and an electrical signal from the printed circuit board 121 is transmitted to the optical transmitter module 123B via the flexible printed circuit board 122B. The optical module 102 and the optical transmission equipment 101 are connected to each other via an electric connector 105. The optical receiver module 123A and the optical transmitter module 123B are electrically connected to the printed circuit board 121, and respectively convert the input optical signal and the electrical signal into the electrical signal and the output optical signal.

A transmission system according to the present embodiment includes two or more pieces of optical transmission equipment 101, two or more optical modules 102, and one or more optical fibers 3. Each optical transmission equipment 101 is connected to one or more optical modules 102. The optical modules 102 respectively connected to two pieces of optical transmission equipment 101 are connected to each other via the optical fibers 103. One optical transmission device 101 generates transmission data, then the optical module 102 connected to one optical transmission device 101 converts the transmission data into an optical signal, and the optical signal is transmitted to the optical fibers 103. The optical signal transmitted over the optical fibers 103 is received by the optical module 102 connected to the other optical transmission equipment 101, the optical module 102 converts the optical signal into an electrical signal, and the electrical signal is transmitted to the other optical transmission equipment 101 as reception data.

Here, a bit rate of electrical signals transmitted from and received by each optical module 102 is 100 Gbit/s. The optical transmitter module 123B performs coarse wavelength division multiplexing (CWDM) which multiplexes light at 25 Gbit/s with four wavelengths at a wavelength interval of 20 nm, and then transmits the multiplexed light at 100 Gbit/s. The optical receiver module 123B can be driven in a wide operation temperature range in an external environment of −40° C. to 85° C.

Figure 2:
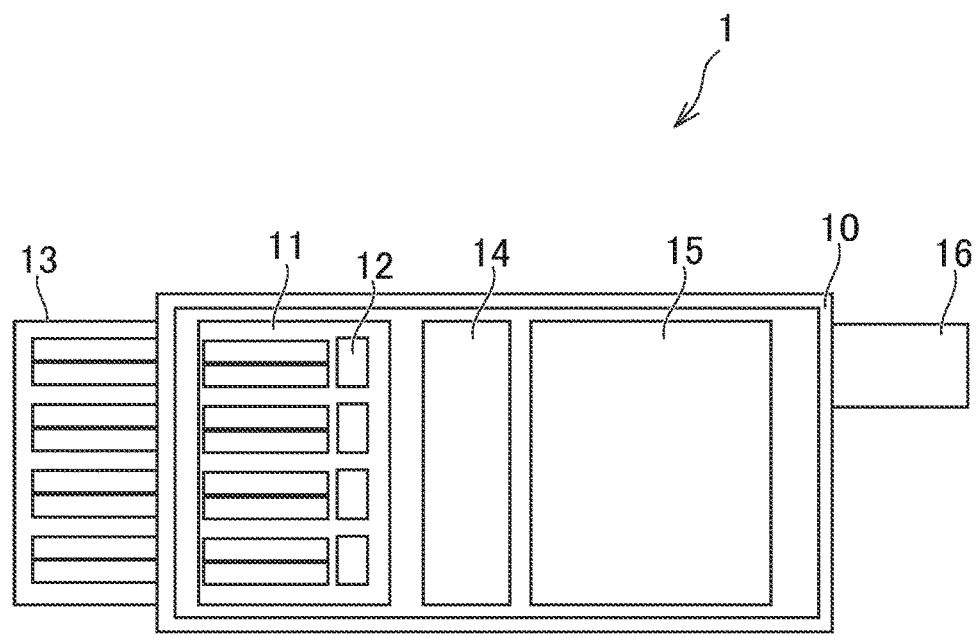
FIG. 2 is a plan view of an optical transmitter module according to the first embodiment of the present invention.

FIG. 2 is a plan view illustrating an optical transmitter module 1 according to the present embodiment. The optical transmitter module 1 is the optical transmitter module 123B illustrated in FIG. 1, for example. The optical transmitter module 1 includes an outer case 10, a submount 11 stored in the outer case 10, and four semiconductor lasers 12 provided on the submount 11. The optical transmitter module 1 is connected to a flexible printed circuit board 13, and each of the four semiconductor lasers 12 is connected to a pair of electrodes. The flexible printed circuit board 13 is, for example, the flexible printed circuit board 122A illustrated in FIG. 1. The optical transmitter module 1 further includes an optical component 14 including four lenses each of which collects light beams emitted from the respective four semiconductor lasers 12, an optical multiplexer 15 which multiplexes light beams emitted from the respective four lenses, and an optical fiber connector 16 which transmits the multiplexed light in the optical multiplexer 15 to the optical fiber. The optical component 14 and the optical multiplexer 15 are stored in the outer case 10, and the optical fiber connector 16 is disposed to penetrate through the outer case 10.

Figure 3A:
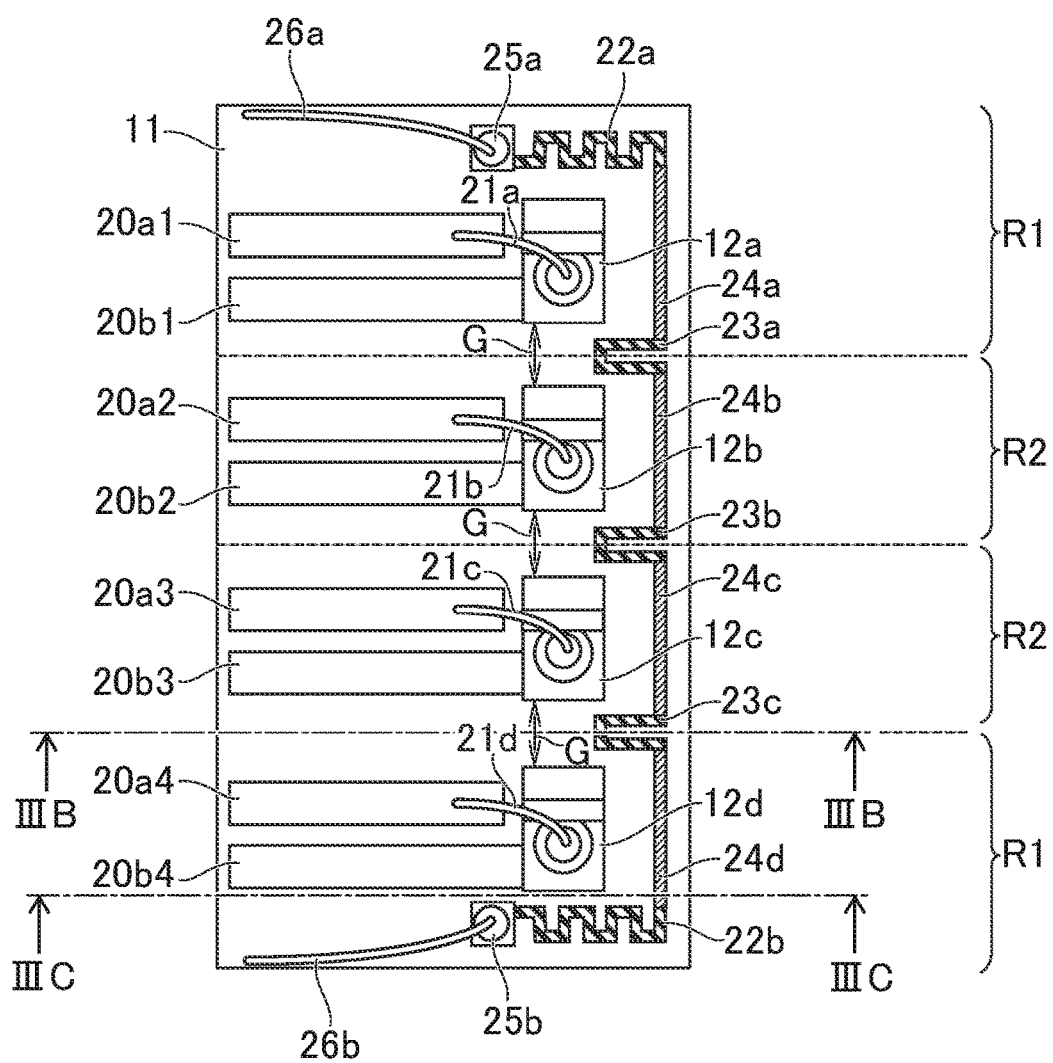
FIG. 3A is a plan view illustrating a submount according to the first embodiment of the present invention.
Figure 3B:
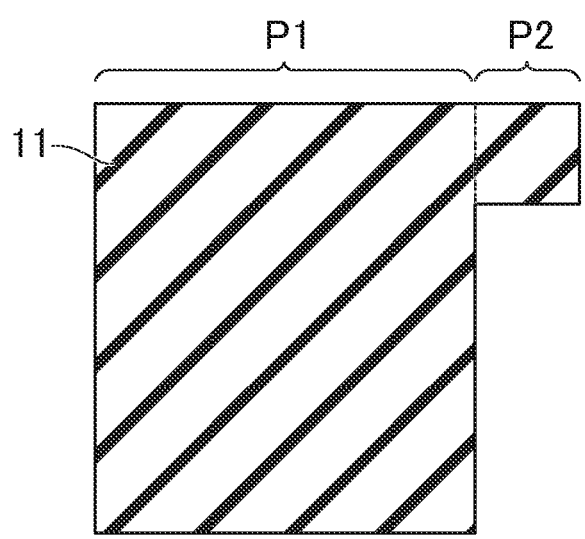
FIG. 3B is a cross sectional view illustrating the submount according to the first embodiment of the present invention.
Figure 3C:
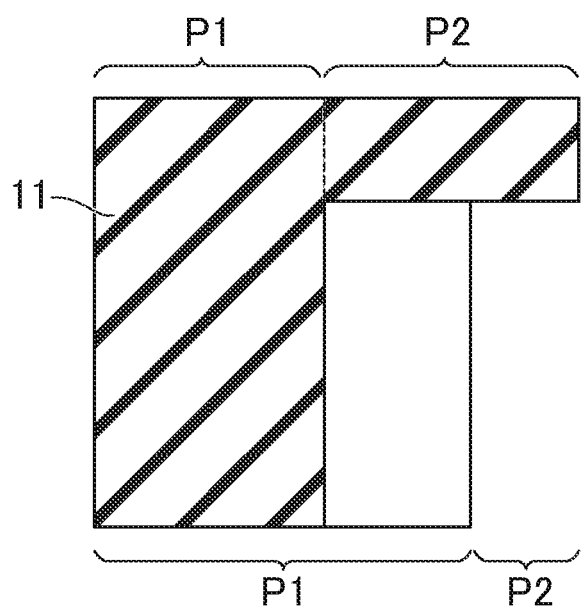
FIG. 3C is a cross sectional view illustrating the submount according to the first embodiment of the present invention.
Figure 3D:
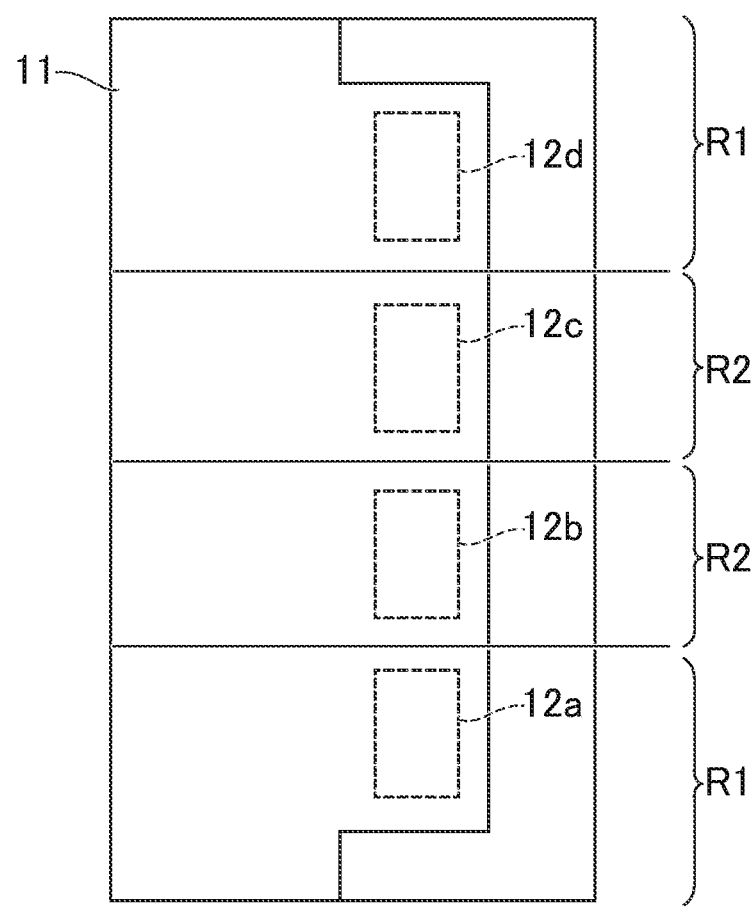
FIG. 3D is a bottom view illustrating the submount according to the first embodiment of the present invention.

FIG. 3A is a plan view illustrating he submount 11 according to the present embodiment. FIGS. 3B and 3C are cross sectional views illustrating the submount 11 according to the present embodiment. FIG. 3B is a cross sectional view taken along the line IIIB-IIIB in FIG. 3A, and FIG. 3C is a cross sectional view taken along the line IIIC-IIIC in FIG. 3A. FIG. 3D is a bottom view illustrating the submount 11 according to the present embodiment.

As illustrated in FIG. 3A, four semiconductor lasers 12a, 12b, 12c and 12d are mounted side by side on a surface (of the mounting surface) of the submount 11 in a first direction (a vertical direction in FIG. 3A). The semiconductor laser 12 is a distributed feedback (DFB) laser. The semiconductor laser 12 includes an active layer having a multiple quantum well structure containing InGaAlAs. The four semiconductor lasers 12a, 12b, 12c and 12d emit light beams with different output wavelengths. A pair of drive electrodes 20a1 and 20b1 made of metal are connected to the semiconductor laser 12a. A p-type electrode (first conductivity type electrode) disposed on an upper surface (front surface) of the semiconductor laser 12a is electrically connected to the p-type (first conductivity type) drive electrode 20a1 via a wire 21a, and an n-type electrode (second conductivity type electrode) (not shown in FIG. 3A) disposed on a lower surface (rear surface) of the semiconductor laser 12a is electrically connected to the drive electrode 20b1 via a metal pattern of the n-type (second conductivity type) drive electrode 20b1. The metal pattern of the drive electrode 20b1 extends to a region in which the semiconductor laser 12a is disposed, and overlaps the n-type electrode of the semiconductor laser 12a, which is electrically connected to the semiconductor laser 12a. This is also the same for the remaining semiconductor lasers 12b, 12c and 12d. The semiconductor laser 12b is connected to a pair of drive electrodes 20a2 and 20b2, the semiconductor laser 12c is connected to a pair of drive electrodes 20a3 and 20b3, and the semiconductor laser 12d is connected to a pair of drive electrodes 20a4 and 20b4. P-type electrodes of the semiconductor lasers 12b, 12c and 12d are respectively connected to the p-type drive electrodes 20a2, 20a3 and 20a4 via wires 21b, 21c and 21d. The four pairs of drive electrodes are connected to the flexible printed circuit board 13 illustrated in FIG. 2.

The submount 11 according to the present embodiment has the mounting surface on which three or more (four in the present embodiment) semiconductor lasers 12 are mounted side by side in the first direction (the vertical direction in FIG. 3A), and, among the three or more (four in the present embodiment) semiconductor lasers 12, the semiconductor laser 12 disposed at one end along the first direction is referred to as a first semiconductor laser. Here, the first semiconductor laser is the semiconductor laser 12a disposed on an upper part in FIG. 3A. The semiconductor laser 12d disposed on a lower part in FIG. 3A may be referred to as the first semiconductor laser. Among the three or more (four in the present embodiment) semiconductor lasers 12, a semiconductor laser disposed to be adjacent to the first semiconductor laser is referred to as a second semiconductor laser. Here, the second semiconductor laser is the semiconductor laser 12b disposed to be adjacent to the semiconductor laser 12a. The semiconductor laser 12c disposed to be adjacent to the semiconductor laser 12d may be the second semiconductor laser. As a material forming a main body of the submount 11, aluminum nitride or silicon is preferably used.

The submount 11 according to the present embodiment is provided with a heat generator for increasing the temperatures of the three or more (four in the present embodiment) semiconductor lasers 12, and the heat generator is disposed on the mounting surface. The heat generator and the three or more (four in the present embodiment) semiconductor lasers 12 are thermally connected to each other via the main body of the submount 11. A main feature of the submount 11 according to the present embodiment is that, where the heat generator generates heat, a first heat of the heat absorbed by the first semiconductor laser (the semiconductor laser 12a or 12d) is larger than a second heat of the heat absorbed by the second semiconductor laser (the semiconductor laser 12b or 12c).

The mounting surface is divided by a perpendicular bisector of a gap G between the semiconductor lasers 12 adjacent to each other in the first direction (the vertical direction in FIG. 3A) among the three or more (four in the present embodiment) semiconductor lasers 12. In a plan view, a region including the first semiconductor laser (the semiconductor laser 12a or 12d) is defined as a first region R1, and a region including the second semiconductor laser (the semiconductor laser 12b or 12c) is defined as a second region R2. The first region R1 is a planar region on the mounting surface, and is also a solid region which is a part of the submount 11 in a plan view. This is also the same for the second region R2. Where the heat generator generates heat, in the submount 11 according to the present embodiment, a heat amount of a first heat generation portion of the heat generator disposed in the first region R1 is preferably larger than a heat amount of a second heat generation portion thereof disposed in the second region R2. Where the heat generator generates heat, in the submount 11, an amount of heat dissipation to an external environment from the first heat generation portion is preferably smaller than an amount of heat dissipation to the external environment from the second heat generation portion.

Hereinafter, the first heat generation portion and the second heat generation portion of the heat generator will be described. The heat generator according to the present embodiment includes high resistance portions 22a and 22b which are respectively disposed at both ends of the submount 11, and low resistance portions 23a, 23b and 23c each of which is disposed on the front side in a light emission direction between the semiconductor lasers 12 adjacent to each other. In other words, in the heat generator, the high resistance portion 22a, the low resistance portions 23a, 23b and 23c, and the high resistance portion 22b are disposed to be arranged in this order from the upper end to the lower end illustrated in FIG. 3A, and the heat generator further includes wiring portions 24a, 24b, 24c and 24d connecting resistance portions adjacent to each other. In the heat generator, the first heat generation portion disposed in the first region R1 including the semiconductor laser 12a (12d) which is the first semiconductor laser includes the high resistance portion 22a (22b), the wiring portion 24a (24d), and a half of the low resistance portion 23a (23c). In the heat generator, the second heat generation portion disposed in the second region R2 including the semiconductor laser 12b (12c) which is the second semiconductor laser includes a half of the low resistance portion 23a (23c), the wiring portion 24b (24c), and a half of the low resistance portion 23b.

As illustrated in FIG. 3A, the high resistance portions 22a and 22b are respectively connected to external power source connection pad portions 25a and 25b, and conductive wires 26a and 26b are connected to the external power source connection pad portions 25a and 25b through wire bonding. The pair of conductive wires (26a and 26b) are connected to an external power source (not illustrated). In other words, a single external power source applies a single voltage to the heat generator provided on the submount 11, and thus the heat generator is driven.

In the present embodiment, a primary heat generation portion of the first heat generation portion is disposed in a side part on one end side (the upper end or the lower end) of the first semiconductor laser (the semiconductor laser 12a or 12b) along the first direction in the first region R1. Here, the term "primary" indicates a heating value of 50% or more. The primary portion of the first heat generation portion is disposed in the side part on one end side, and thus there is provided a structure in which heat generated by the first heat generation portion is transferred to the first semiconductor laser, and is not further transferred to the second semiconductor laser.

In the heat generator, the first heat generation portion and the second heat generation portion are connected in series to each other, and thus heating values of the first heat generation portion and the second heat generation portion are respectively proportional to a resistance value of the first heat generation portion and a resistance value of the second heat generation portion. In the present embodiment, the high resistance portions 22a and 22b, and the low resistance portions 23a, 23b and 23c have higher resistivity (than that of the wiring portions), and are made of the same material. Here, such a material is preferably tantalum nitride, and is not limited thereto, and, for example, NiCr or Ta—SiO$_2$ may be used. A thin film resistor may be made of such a material. The wiring portions 24a, 24b, 24c and 24d are made of the same material (as that of the high resistance portions and the low resistance portions), and thus the heat generator can be realized through a simple process. A length of the high resistance portion 22a (22b) is larger than a length of the low resistance portion 23a (23c) such that a resistance value of the high resistance portion 22a (22b) is greater than a resistance value of the low resistance portion 23a (23c). Widths or thicknesses of both of the two portions are substantially the same as each other. The high resistance portion 22a (22b) is formed to be bent and extend in a zigzag shape between the wiring portion 24a (24d) and the external power source connection pad portion 25a (25b), and thus the high resistance portion 22a (22b) can be lengthened. Each of the low resistance portions 23a, 23b and 23c is formed by connecting ends on the rear side of a pair of resistors which extend in parallel to each other from the front side to the rear side in the emission direction in a region between the semiconductor lasers 12 adjacent to each other. In the present embodiment, one of the pair of resistors of the low resistance portion 23a (23c) is disposed in the first region R1, the other thereof is disposed in the second region R2, and a resistor connecting the ends of the pair resistors on the rear side to each other is disposed to stride over the boundary between the first region R1 and the second region R2. The low resistance portion 23b is formed in the same aspect, one of a pair of resistors is disposed in one second region R2, and the other thereof is disposed in the other second region R2. Since the resistance value of the first heat generation portion is greater than the resistance value of the second heat generation portion, where the heat generator generates heat, a heating value of the first heat generation portion is greater than a heating value of the second heat generation portion. As mentioned above, the first heat generation portion and the second heat generation portion of the heat generator have been described.

The submount 11 has a thick plate portion P1 and a thin plate portion P2. Hereinafter, the thick plate portion P1 and the thin plate portion P2 will be described. An area of the bottom surface of the main body of the submount 11 is smaller than an area of the mounting surface. The submount 11 protrudes in an eaves shape so as to surround the front side and both lateral sides of the three or more (four in the present embodiment) semiconductor lasers 12 in the emission direction. The main body of the submount 11 is classified into the thick plate portion P1 and the thin plate portion P2 depending on a thickness of the main body of the submount 11 along a vertical direction (a vertical direction in FIGS. 3B and 3C: a direction perpendicular to the mounting surface). A portion protruding in an eaves shape is referred to as the thin plate portion P2, and the remaining portion is referred to as the thick plate portion P1. The thin plate portion P2 is thinner than the thick plate portion P1. The thick plate portion P1 does not necessarily have the same thickness in the entire region in a plan view, and may include a thicker or thinner portion than a primary portion of the thick plate portion P1 due to some circumstances.

As illustrated in FIGS. 3A and 3D, the heat generator according to the present embodiment is disposed in the thin plate portion P2 on the mounting surface. In contrast, the three or more (four in the present embodiment) semiconductor lasers 12 according to the present embodiment are disposed in the thick plate portion P1 on the mounting surface. A pair of drive electrodes 20a and 20b connected to each semiconductor laser 12 are also disposed in the thick plate portion P1 on the mounting surface. The external power source connection pad portions 25a and 25b are disposed in the thin plate portion P2 on the mounting surface. An area of the thin plate portion P2 of the first region R1 is preferably larger than an area of the thin plate portion P2 of the second region R2.

Since the semiconductor laser 12 (and the pair of drive electrodes) are disposed in the thick plate portion P1, where the semiconductor laser 12 is driven, heat emitted from the semiconductor laser 12 (and the pair of drive electrodes) is transferred to the thick plate portion P1 of the submount 11, so as to be dissipated to an external environment from the bottom surface of the submount 11, and thus heat dissipation of the submount 11 is not damaged. In contrast, since the heat generator is disposed in the thin plate portion P2, heat generated from the heat generator is prevented from being dissipated to an external environment from the bottom surface of the submount 11. Therefore, the submount 11 has a structure in which heat generated from the heat generator is transferred to the three or more semiconductor lasers 12 more than where the thin plate portion P2 is not provided (the entire submount 11 is the thick plate portion P1). Therefore, heat generated from the heat generator is efficiently transferred to the semiconductor lasers 12, and thus the temperatures of the semiconductor lasers 12 can be increased with small power. As described above, in the submount 11, an amount of heat dissipation to an external environment from the first heat generation portion is more preferably smaller than an amount of heat dissipation to the external environment from the second heat generation portion.

Figure 4A:
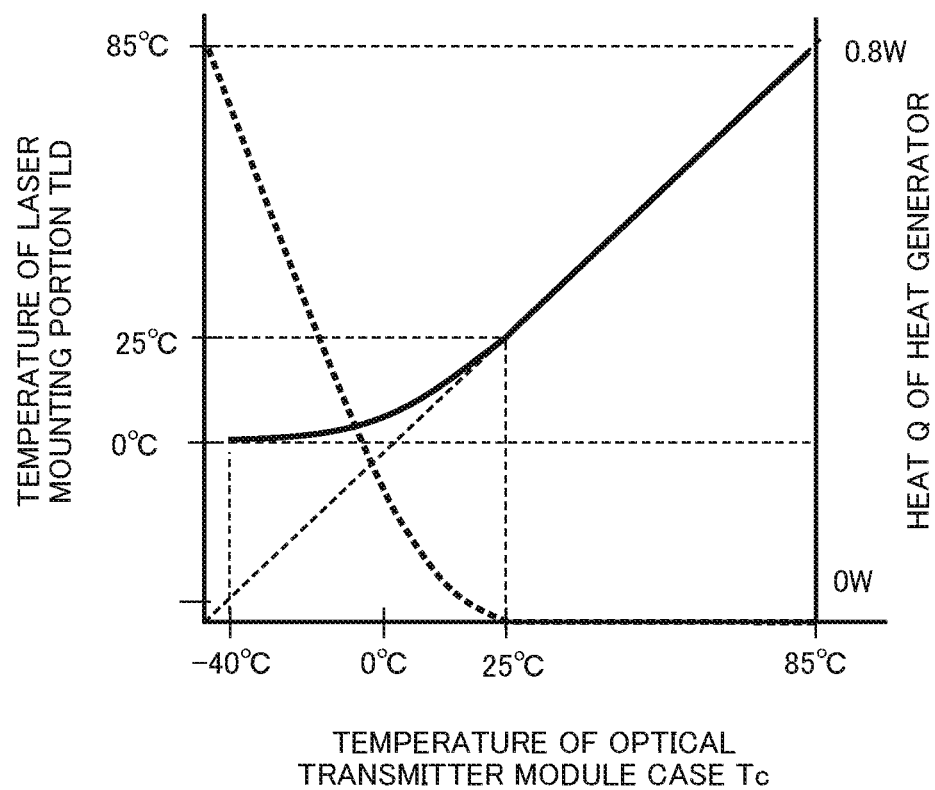
FIG. 4A is a graph illustrating the temperature of a semiconductor laser and a heating value of a heat generator for a case temperature.

FIG. 4A is a graph illustrating the temperature TLD of the semiconductor laser 12 and a heating value Q of the heat generator for a case temperature Tc. The optical transmitter module 1 according to the present embodiment can be driven in a wide temperature range in an external environment of −40° C. to 85° C. A Peltier element is not used for the optical transmitter module 1 according to the present embodiment. The case temperature Tc is the temperature of the case (casing) of the optical transmitter module 1, and the temperature TLD is a temperature of the vicinity of the semiconductor laser 12 during driving. The optical transmitter module 1 is stored in the optical module 102, but the temperature of an external environment (an ambient temperature) is generally defined by a temperature of the periphery of the optical module 102. The temperature of the optical transmitter module 1 is not controlled, and is thus substantially the same as the temperature of the optical module 102. Strictly speaking, a thermal equilibrium state occurs in a state in which the temperature of optical transmitter module 1 is slightly higher due to connection resistance between the optical module 102 and the optical transmitter module 1, but the temperatures of both of the two modules are assumed to be substantially the same as each other for simplification of description. As illustrated in FIG. 4A, the temperature TLD of the semiconductor laser 12 is the same as the case temperature Tc of the optical transmitter module 1 at a high temperature, but, strictly, thermal equilibrium frequently occurs in a state in which the temperature of the semiconductor laser 12 is slightly higher, but both of the temperatures are assumed to be the same as each other for simplification of description.

A dashed line illustrated in FIG. 4A indicates the heating value Q of the heat generator for the case temperature Tc, and, in the optical transmitter module 1 according to the present embodiment, the heating value Q of the heat generator is adjusted according to the case temperature Tc (external environment). Herein, the heating value Q is 0.8 W at the case temperature Tc of −40° C., the heating value Q is reduced due to an increase in the case temperature Tc, and the heating value Q of the heat generator is set to 0 at the case temperature Tc of 25° C. or higher. A solid line illustrated in FIG. 4A indicates the temperature TLD of the semiconductor laser 12 where the heat generator generates heat corresponding to the heating value Q, and, even if the case temperature Tc is −40° C., the temperature TLD increases to 0° C. The temperature TLD increases to a temperature higher than 0° C. according to the heating value Q of the heat generator due to an increase in the case temperature Tc, and the temperature TLD is the same as the temperature Tc in a temperature region higher than the temperature of 25° C.

A method for controlling the submount 11 (optical transmitter module 1) according to the present embodiment is characterized in that, when the optical transmitter module 1 (that is, the semiconductor laser 12) is operated, where an ambient temperature is equal to or lower than first temperature, a current with magnitude corresponding to the ambient temperature is made to flow through the heat generator, and, where the environmental temperature is higher than the first temperature, a current is made not to flow through the heat generator. At the first temperature or less, an external power source applies a desired voltage between the external power source connection pad portions 25a and 25b such that a current flows through the heat generator, and thus the heat generator generates heat. Herein, where an operable region of the semiconductor laser 12 is 0° C. to 85° C., the optical transmitter module 1 in which the semiconductor laser 12 is mounted on the submount 11 cannot obtain favorable characteristics under an external environment of 0° C. or lower without using the heat generator. However, at the first temperature or lower, a current is made to flow through the heat generator such that the heat generator generates heat corresponding to the heating value Q. Therefore, even at the first temperature or lower, the temperature of the semiconductor laser 12 can be increased to a temperature higher than the lower limit of the operable range of the semiconductor laser 12, and thus it is possible to realize the optical transmitter module 1 which can be operated in a wide temperature range. Herein, as illustrated in FIG. 4A, the first temperature is the room temperature (for example, 25° C.), but the first temperature may be set to any value according to characteristics of the semiconductor laser 12 and/or the submount 11.

In order to determine the heating value Q of the heat generator, first, a temperature sensor is provided on the submount 11 or near the submount 11. The temperature of the submount 11 is measured by the temperature sensor where a voltage is applied to each of the external power source connection pad portions 25a and 25b (heat generator) from an external power source. A relationship between an applied voltage and a temperature in the temperature sensor obtained through the measurement is stored in a lookup table. For example, where a range of an external environmental temperature (case temperature Tc) is −40° C. to 85° C., a voltage is not applied to the heat generator in the range from the room temperature which is the first temperature to 85° C., and the optical transmitter module 1 is operated at a temperature corresponding to the external environmental temperature. At a temperature which is equal to or lower than the room temperature which is the first temperature, a heating value is preferably set such that a surface temperature of the submount 11 mounted with the semiconductor lasers is not lower than 0° C. Consequently, it is possible to obtain desired RF characteristics even if a plurality of semiconductor lasers are under a low temperature environment. It is possible to suppress an output wavelength change of the semiconductor laser due to a temperature change, and thus to improve wavelength stability in wavelength multiplex communication.

Figure 4B:
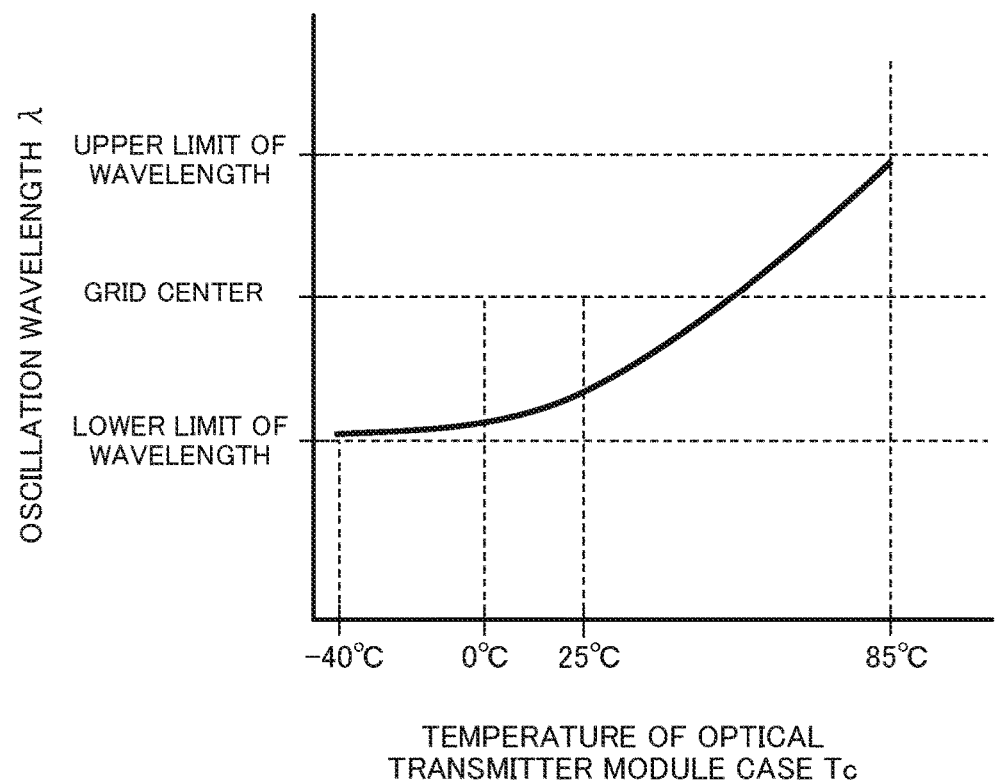
FIG. 4B is a graph illustrating an output wavelength of a semiconductor laser for a case temperature.

FIG. 4B is a graph illustrating an output wavelength λ of the semiconductor laser 12 for the case temperature Tc. FIG. 4B illustrates the output wavelength λ of the semiconductor laser 12 where the heating value Q of the heat generator is appropriately controlled. There may be the following two factors to change the output wavelength λ of the semiconductor laser 12. First, an effective refractive index of the semiconductor laser 12 changes due to a temperature change. Second, a drive current flowing through the semiconductor laser 12 changes depending on an ambient temperature.

The semiconductor laser 12 is driven with a low current, especially, at low temperature due to such factors, and thus a submode suppression rate tends to be unstable. In contrast, in the optical transmitter module 1 according to the present embodiment, the temperature of the semiconductor laser 12 is increased with high efficiency by heat generated from the heat generator, and thus a submode suppression rate hardly changes. Therefore, it is possible to reduce a kink of the semiconductor laser 12.

Figure 5:
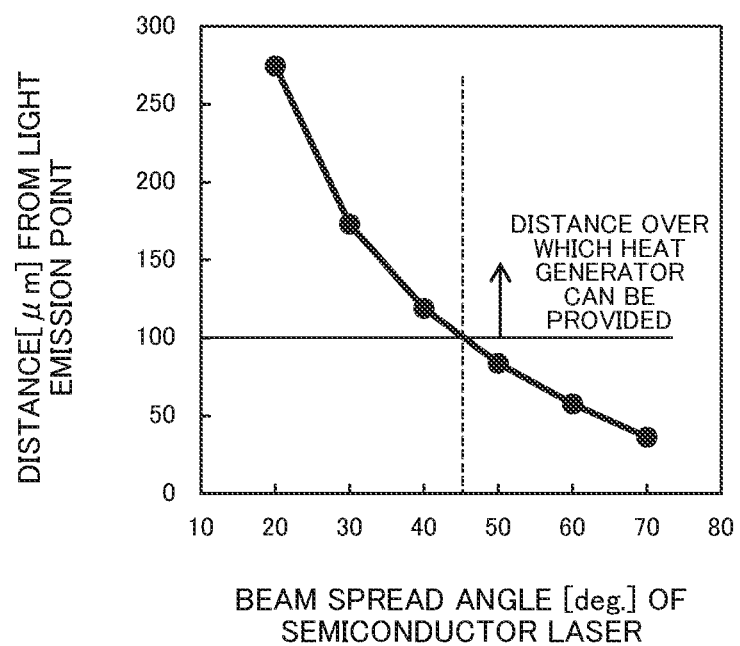
FIG. 5 is a graph illustrating a calculation result of an allowable range from a light emission point for a beam spread angle of a semiconductor laser according to the first embodiment of the present invention.

FIG. 5 is a graph illustrating a computation result of an allowable distance from a light emission point for a beam spread angle of the semiconductor laser 12 according to the present embodiment. The heat generator is disposed between the semiconductor laser 12 of the submount 11 and the corresponding lens included in the optical component 14 in the light emission direction. In the present embodiment, a central point (light emission central point) of light emitted from the semiconductor laser 12 is located at a position from the mounting surface of the submount 11 by 100 μm. Here, as illustrated in FIG. 5, where a far field pattern of the semiconductor laser 12 is 45° in terms of the full width at half maximum, an allowable distance over which light emitted from the semiconductor laser 12 reaches the condensing lens without a loss is about 100 μm from the light emission central point of the semiconductor laser to the end of the submount 11 on the light emission side. Therefore, it is possible to provide a sufficient margin with which the heat generator is disposed on the mounting surface of the submount 11, high accuracy is not necessary in a manufacturing process for the submount 11, and a cost increase can be suppressed.

Figure 6:
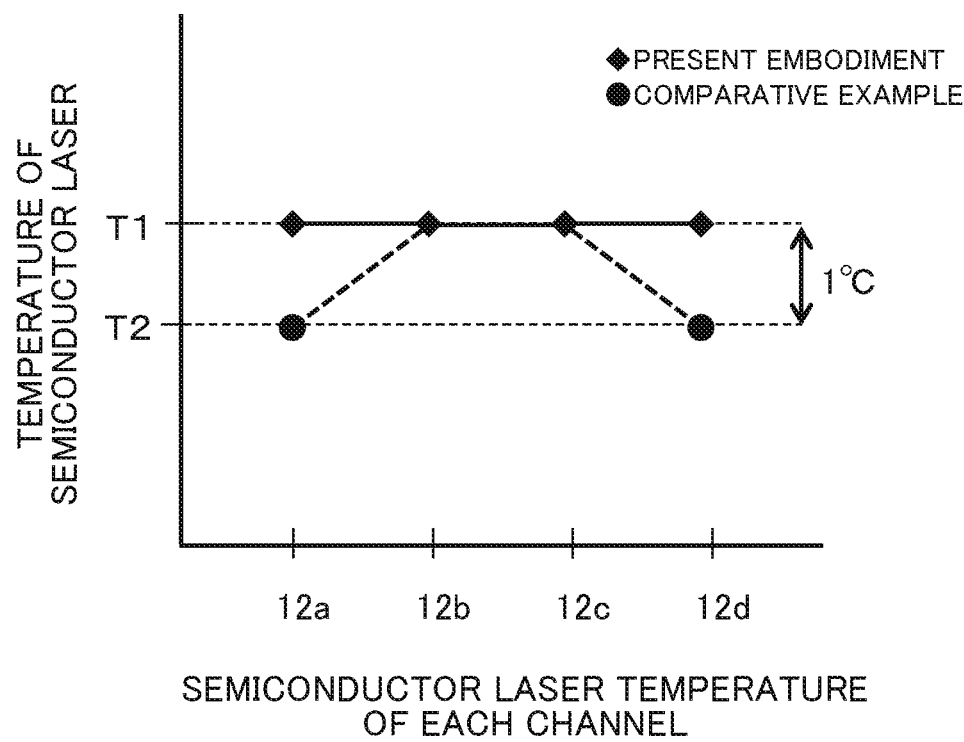
FIG. 6 is a graph illustrating the temperature of a semiconductor laser of each channel of the optical transmitter module in the first embodiment of the present invention.

FIG. 6 is a graph illustrating the temperature TLD of the semiconductor laser 12 of each channel of the optical transmitter module 1 in the present embodiment. In FIG. 6, at low temperature (for example, −30° C.), a temperature distribution of the temperature TLD of the semiconductor laser 12 according to the present embodiment is indicated by a solid line and the symbol ♦, and a temperature distribution of the temperature TLD of a semiconductor laser according to a comparative example is indicated by a dashed line and the symbol ●. Here, an optical transmitter module according to the comparative example has a structure in which heat amounts absorbed by four semiconductor lasers are the same as each other. The temperature of the semiconductor laser can be increased to a temperature range in which the semiconductor laser can be operated by heat generated from the heat generator. However, where heat amounts absorbed by the four semiconductor lasers from the heat generator are the same as each other as in the comparative example, the present inventors have found, through keen examination, that a significant temperature difference such as 1° C. occurs between the first semiconductor laser and the second semiconductor laser as in the temperature distribution of the temperature TLD in the comparative example illustrated in FIG. 6. During driving, the semiconductor laser 12 generates heat, most of the heat is transferred to the bottom surface of the submount 11, and is dissipated to an external environment, but part of the heat is transferred to the semiconductor lasers 12 adjacent thereto on both sides, and thus the temperatures of the semiconductor lasers 12 are increased. Whereas the number of semiconductor lasers adjacent to the first semiconductor laser is one, the number of semiconductor lasers adjacent to the second semiconductor laser is two, a significant temperature difference may occur between the temperature TLD of the second semiconductor laser of which the temperature is increased by the two adjacent semiconductor lasers and the temperature TLD of the first semiconductor laser of which the temperature is increased by the second semiconductor laser. In contrast, the optical transmitter module 1 according to the present embodiment has a structure in which the first heat amount absorbed by the first semiconductor laser is larger than the second heat amount absorbed by the second semiconductor laser, and, thus, as illustrated in FIG. 6, a temperature difference between the first semiconductor laser and the second semiconductor laser is reduced. More preferably, the temperatures TLD of the three or more (four in the present embodiment) semiconductor lasers are uniformly distributed. The maximum power consumption of the heat generator is 0.8 W as illustrated in FIG. 4A. The maximum power consumption of the heat generator of the optical transmitter module 1 according to the present embodiment is considerably reduced to a half or less compared with the maximum power consumption of a Peltier element in an optical transmitter module including the Peltier element. There may be a case where a temperature difference occurs between the first semiconductor laser and the second semiconductor laser not only at a low temperature but also at a high temperature. In this case, a temperature difference between the semiconductor lasers may be reduced by causing a current to flow through the heat generator.

A transmission capacity increase per front panel of a router or a switch has been required in optical communication due to the recent information transmission capacity increase, and thus it is necessary to make miniaturization and achievement of low power consumption of an optical transceiver (optical module). Compared with a discrete type optical transmitter module in which a single semiconductor laser is mounted on a single submount, and a plurality of such submounts are provided, an optical transmitter module in which a plurality of semiconductor lasers are integrated on a single submount hybridly has been recently used, and thus considerable miniaturization of an optical transmitter module has progressed. In order to achieve lower power consumption, an optical transceiver which operates at, for example, 0° C. to 85° C. without using a Peltier element used to adjust the temperature of a submount on which a plurality of semiconductor lasers are mounted is available in the market. An optical transmitter module having an operation temperature range (for example, −40° C. to 85° C.) expanding toward a lower temperature side than the operation temperature range of the related art is desirable, and thus the present invention is suitable for such an optical transmitter module.

Second Embodiment

The submount 11 according to a second embodiment of the present invention has the same structure as that of the submount 11 according to the first embodiment except for a structure of a heat generator.

Figure 7A:
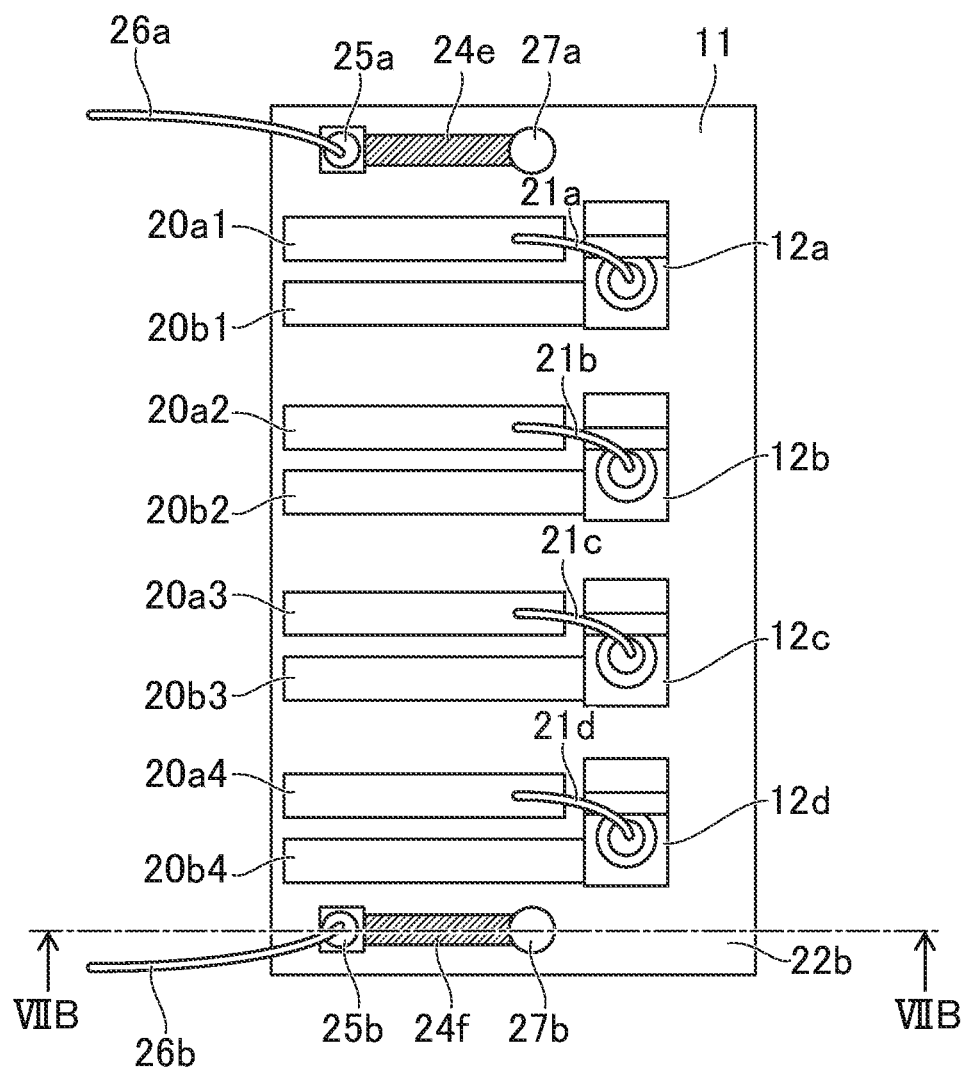
FIG. 7A is a plan view illustrating a submount according to a second embodiment of the present invention.
Figure 7B:
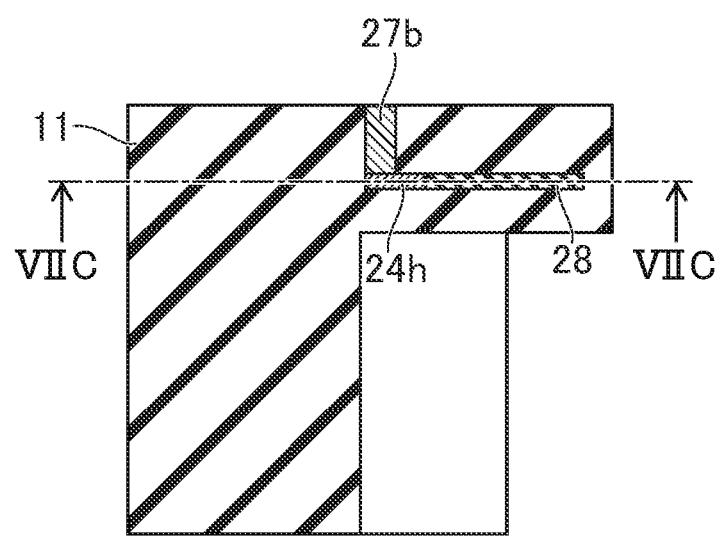
FIG. 7B is a cross sectional view illustrating the submount according to the second embodiment of the present invention.
Figure 7C:
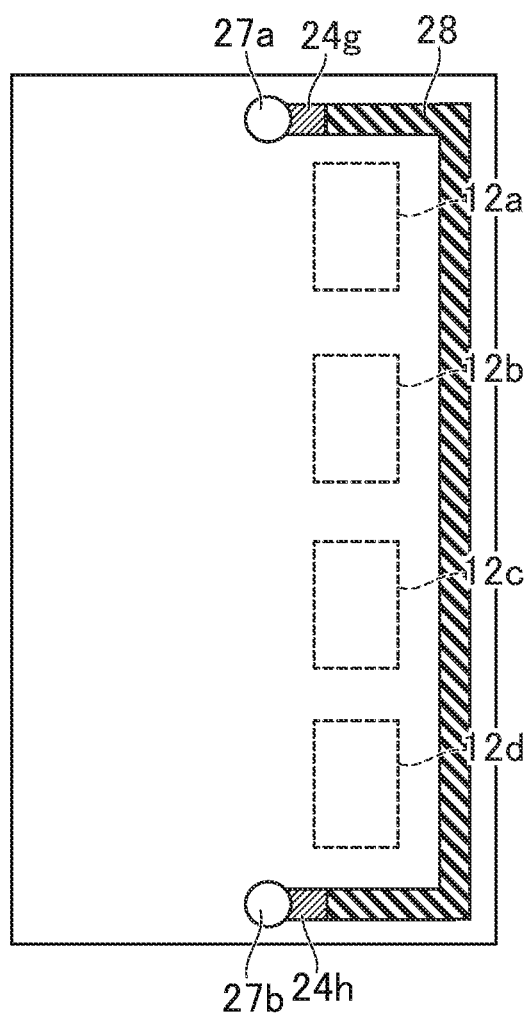
FIG. 7C is a cross sectional view illustrating the submount according to the second embodiment of the present invention.

FIG. 7A is a plan view illustrating the submount 11 according to the present embodiment. FIGS. 7B and 7C are cross sectional views illustrating the submount 11 according to the present embodiment. FIG. 7B is a cross sectional view taken along the line VIIB-VIIB in FIG. 7A, and FIG. 7C is a cross sectional view taken along the line VIIC-VIIC in FIG. 7B.

The submount 11 according to the present embodiment has the thick plate portion P1 and the thin plate portion P2 in the same manner as in the first embodiment. The heat generator according to the present embodiment is disposed in the thin plate portion P2 in the same manner as in the first embodiment, but is disposed not on the mounting surface but inside the submount 11. In the same manner as in the first embodiment, the external power source connection pad portions 25*a* and 25*b* are respectively disposed at both ends of three or more (four in the present embodiment) semiconductor lasers 12 arranged in the first direction on the mounting surface of the submount 11. Wiring portions 24*e* and 24*f* are respectively connected to the external power source connection pad portions 25*a* and 25*b*, and extend along the light emission direction. Conduction vias 27*a* and 27*b* are via-holes through which the mounting surface of the submount 11 is connected to a layer in which a primary portion of the heat generator is disposed, and the wiring portions 24*e* and 24*f* are respectively connected to the conduction vias 27*a* and 27*b*.

As illustrated in FIG. 7C, a wiring portion 24*g*, a resistance portion 28, and a wiring portion 24*h* are disposed to be arranged in this order so as to surround both of the lateral sides and the front side of the three or more (four in the present embodiment) semiconductor lasers 12 arranged in the first direction in a plan view between the conduction vias 27*a* and 27*b*. Herein, the heat generator includes the resistance portion 28 and the wiring portions 24*g* and 24*h*, but may further include the wiring portions 24*e* and 24*f* and the conduction vias 27*a* and 27*b*. In either case, heat generated from the heat generator is generated from almost only the resistance portion 28. The resistance portion 28 is made of a material having higher resistivity, such as tantalum nitride (than the wiring portion) in the same manner as high resistance portions 22*a* and 22*b* and the low resistance portions 23*a*, 23*b* and 23*c*. The resistance portion 28 is disposed to surround (parts of) the lateral sides and the front side of three or more (four in the present embodiment) semiconductor lasers 12. Thus, the first heat generation portion is longer than the second heat generation portion, and a resistance value of the first heat generation portion is greater than a resistance value of the second heat generation portion. Therefore, where the heat generation portion generates heat, a heat amount of the first heat generation portion is larger than a heat amount of the second heat generation portion. Since the resistance portion 28 (and the wiring portions 24*g* and 24*h*) is disposed in the thin plate portion P2, heat generated from the heat generator is prevented from being dissipated to an external environment from the bottom surface of the submount 11 in the same manner as in the first embodiment. Therefore, heat generated from the heat generator is transferred to the semiconductor laser 12 more efficiently, and thus the temperature of the semiconductor laser 12 can be increased with small power. In the same manner as in the first embodiment, in the submount 11, an amount of heat dissipation to an external environment from the first heat generation portion is more preferably smaller than an amount of heat dissipation to the external environment from the second heat generation portion. Therefore, where the heat generator generates heat, the first heat amount absorbed by the first semiconductor laser is larger than the second heat amount absorbed by the second semiconductor laser, and thus a temperature difference between the first semiconductor laser and the second semiconductor laser is reduced.

Figure 7D:
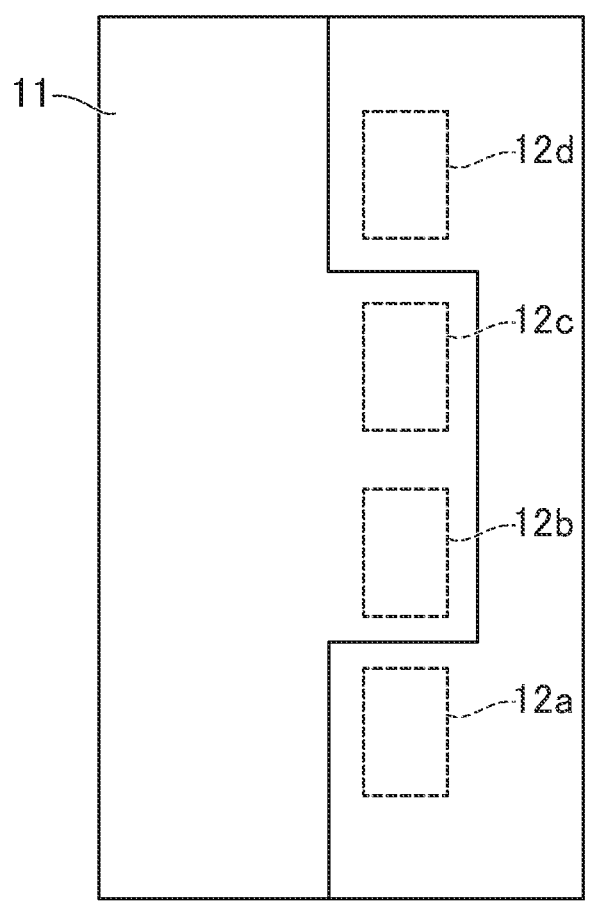
FIG. 7D is a bottom view illustrating a modification example of the submount according to the second embodiment of the present invention.

FIG. 7D is a bottom view illustrating a modification example of the submount 11 according to the present embodiment. From the viewpoint that heat dissipation of heat from the semiconductor laser is not damaged, the three or more (four in the present embodiment) semiconductor lasers 12 are preferably disposed in the thick plate portion P1 in the same manner as in the first embodiment. However, from the viewpoint of reducing a temperature difference between the first semiconductor laser and the second semiconductor laser, as illustrated in FIG. 7D, there may be a configuration in which the semiconductor lasers 12a and 12d on both sides are disposed in the thin plate portion P2, that is, the first semiconductor laser is disposed in the thin plate portion P2. Priority of heat dissipation of heat emitted from the semiconductor laser and heat dissipation of heat generated from the heat generator may be selected through examination.

Third Embodiment

The submount 11 according to a third embodiment of the present invention has the same structure as that of the submount 11 according to the first and second embodiments except for a structure of a heat generator.

Figure 8:
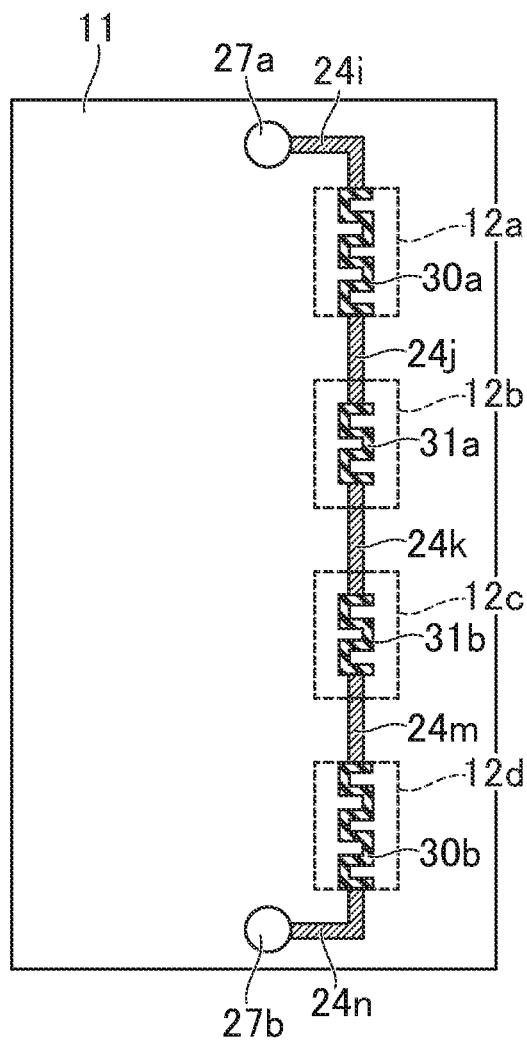
FIG. 8 is a cross sectional view illustrating a submount according to a third embodiment of the present invention.

FIG. 8 is a cross sectional view illustrating the submount 11 according to the present embodiment. FIG. 8 corresponds to a cross sectional view taken along the line VIIC-VIIC in FIG. 7B. The submount 11 according to the present embodiment has the thick plate portion P1 and the thin plate portion P2 in the same manner as in the first and second embodiments. In the heat generator according to the present embodiment, a primary heat generation portion of the first heat generation portion is disposed under the first semiconductor laser (the semiconductor laser 12a or 12d) in the first region R1, and a primary heat generation portion of the second heat generation portion is disposed under the second semiconductor laser (the semiconductor laser 12b or 12c) in the second region R2. As illustrated in FIG. 8, the heat generator includes high resistance portions 30a and 30b respectively disposed under the first semiconductor lasers (the semiconductor lasers 12a and 12d), and low resistance portions 31a and 31b respectively disposed under the second semiconductor lasers (the semiconductor lasers 12b and 12c). The heat generator further includes wiring portions 24i, 24j, 24k, 24m and 24n from the conduction via 27a to the conduction via 27b such that resistance portions adjacent to each other are connected to each other. The high resistance portions 30a and 30b, and the low resistance portions 31a and 31b have higher resistivity (than that of the wiring portions), and are made of the same material such as tantalum nitride. A length of the high resistance portion 30a (30b) is larger than a length of the low resistance portion 31a (31b) such that a resistance value of the high resistance portion 30a (30b) is greater than a resistance value of the low resistance portion 31a (31b). The high resistance portions 30a and 30b and the low resistance portions 31a and 31b are bent and extend in a zigzag shape together such that lengths of the high resistance portions 30a and 30b and lengths of the low resistance portions 31a and 31b are secured. The submount 11 has the same structure as that in the second embodiment except for the structure of the heat generator illustrated in FIG. 8. The low resistance portion in the present embodiment is not disposed between two semiconductor lasers, but is referred to as a low resistance portion for convenience of description. A function thereof is as described above.

A length of the high resistance portion 30a (30b) is larger than a length of the low resistance portion 31a (31b), a resistance value of the high resistance portion 30a (30b) is greater than a resistance value of the low resistance portion 31a (31b), and, where the heat generator generates heat, a heat amount of the first heat generation portion is larger than a heat amount of the second heat generation portion. Since the high resistance portions 30a and 30b and the low resistance portions 31a and 31b are respectively disposed under the three or more (four in the present embodiment) semiconductor lasers 12, heat generated from the heat generator is transferred to the semiconductor laser 12 more efficiently, and thus the temperature of the semiconductor laser 12 can be increased with small power. Therefore, where the heat generator generates heat, the first heat amount absorbed by the first semiconductor laser is larger than the second heat amount absorbed by the second semiconductor laser, and thus a temperature difference between the first semiconductor laser and the second semiconductor laser is reduced. The high resistance portion 30a (30b) is a primary heat generation portion of the first heat generation portion. The low resistance portion 31a (31b) is a primary heat generation portion of the second heat generation portion. Where the heat generator generates heat, a heating value of the high resistance portion 30a (30b) occupies most (for example, at least 90%) of the heating value of the first heat generation portion. Similarly, a heating value of the low resistance portion 31a (31b) occupies most (for example, at least 90%) of the heating value of the second heat generation portion.

In the same manner as in the variation of the second embodiment illustrated in FIG. 7D, from the viewpoint of reducing a temperature difference between the first semiconductor laser and the second semiconductor laser, it is contemplated that the semiconductor lasers 12a and 12d on both sides are disposed in the thin plate portion P2, that is, the first semiconductor laser is disposed in the thin plate portion P2. Priority of heat dissipation of heat emitted from the semiconductor laser and heat dissipation of heat generated from the heat generator may be selected through examination.

As mentioned above, the submount, the optical transmitter module, the optical module, and the optical transmission equipment, and the control method therefor according to the embodiments of the present invention have been described. The present invention is not limited to the above-described embodiments, and is widely applicable to various heat generation bodies. In the embodiments, an operation temperature range of an ambient temperature in which the optical transmitter module 1 can be operated is −40° C. to 85° C., and an operation temperature range in which the semiconductor laser 12 can be operated is 0° C. to 85° C., but the operation temperature ranges are only examples. For example, an operation temperature range in which the semiconductor laser 12 can be operated may be −20° C. to 85° C., and any temperature may be set. For example, an operation temperature range of an ambient temperature in which the optical transmitter module 1 can be operated may be −55° C. to 95° C. In the embodiments, three or more semiconductor lasers emit light beams with different output wavelengths, but are not limited thereto, and may emit light beams with the same output wavelength.

In the embodiments, as each of the three or more semiconductor lasers 12, a DFB laser is used, but this is only an example. For example, any one of a Fabry-Perot laser, a distributed Bragg reflector (DBR) laser, a DFB laser in which a mode magnifier for improving the efficiency of optical coupling with an optical fiber is integrated, and a DFB laser in which an external modulator is integrated or is connected to a waveguide may be used. Needless to say, the same effect can be achieved even using a surface emission type semiconductor laser. In the embodiments, the heat generator is a single resistor in which the respective portions are connected in series to each other, but is not limited thereto, and may have a structure in which a plurality of resistors are connected in parallel to each other in a case of being driven by an external power source.

Control methods for the submount 11, the optical transmitter module, the optical module, and the optical transmission equipment may employ any well-known methods. For example, PID control or digital control may be used. Any heating value Q of the heat generator corresponding to the case temperature Tc may be selected by a user as long as the heating value is included in an operation temperature range of the semiconductor laser 12, and may not be a downwardly convex curve as illustrated in FIG. 4A.

A material of the submount 11 is not particularly limited as long as desired heat conduction can be obtained, but aluminum nitride or silicon is preferably used. In the embodiments, a drive IC circuit is not mounted on the submount 11, but is not limited thereto, and a drive IC circuit maybe integrated onto the submount. A temperature control module for controlling the heating value Q of the heat generator may be integrated onto the submount 11. Needless to say, the effects of the present invention can also be achieved where a temperature sensor or a heater is integrated onto the submount 11.

In the embodiments, the semiconductor laser 12 includes an active layer having a multiple quantum well structure containing InGaAlAs, but is not limited thereto. A material of the active layer may be an InGaAsP base.

While there have been described what are at present considered to be certain embodiments of the invention, it will be understood that various modifications maybe made thereto, and it is intended that the appended claims cover all such modifications as fall within the true spirit and scope of the invention.

What is claimed is:

1. A submount which has a mounting surface on which three or more semiconductor lasers including a first semiconductor laser and a second semiconductor laser are arranged in a first direction, the submount comprising:
   a heat generator configured to increase the temperatures of the three or more semiconductor lasers,
   wherein, where the heat generator generates heat, a first heat of the heat absorbed by the first semiconductor laser disposed at one end along the first direction is larger than a second heat of the heat absorbed by the second semiconductor laser disposed to be adjacent to the first semiconductor laser on the mounting surface.

2. The submount according to claim 1,
   wherein, where the mounting surface is divided by a bisector of a gap between two adjacent semiconductor lasers of the three or more semiconductor lasers perpendicular to the first direction, and, in a plan view, the mounting surface comprises a first region including the first semiconductor laser, and a second region including the second semiconductor laser,
   when the heat generator generates heat, a heat of a first heat generation portion of the heat generator disposed in the first region is greater than a heat of a second heat generation portion of the heat generator disposed in the second region.

3. The submount according to claim 2,
   wherein the first heat generation portion and the second heat generation portion are connected in series to each other, and
   wherein the heat generator is driven by a single external power source.

4. The submount according to claim 2,
   wherein each of the first region and the second region comprises a thick plate portion and a thin plate portion thinner than the thick plate portion, and
   wherein a primary heat generation portion of the first heat generation portion faces a side of the first semiconductor laser on the one end side along the first direction in the first region.

5. The submount according to claim 4,
   wherein the heat generator is disposed in the thin plate portion on the mounting surface.

6. The submount according to claim 4,
   wherein the first semiconductor laser is disposed in the thick plate portion on the mounting surface.

7. The submount according to claim 4,
   wherein the three or more semiconductor lasers are disposed in the thick plate portion on the mounting surface.

8. The submount according to claim 4,
   wherein the first region has a thick plate portion and a thin plate portion thinner than the thick plate portion, and
   wherein the first semiconductor laser is disposed in the thin plate portion of the first region.

9. The submount according to claim 2,
   wherein a primary heat generation portion of the first heat generation portion is disposed under the first semiconductor laser in the first region.

10. The submount according to claim 9,
    wherein a primary heat generation portion of the second heat generation portion is disposed under the second semiconductor laser in the second region.

11. The submount according to claim 4,
    wherein an area of the thin plate portion of the first region is larger than an area of the thin plate portion of the second region.

12. The submount according to claim 2,
    wherein an amount of heat dissipation to an external environment from the first heat generation portion is smaller than an amount of heat dissipation to the external environment from the second heat generation portion.

13. An optical transmitter module comprising:
    the submount according to claim 1; and
    the three or more semiconductor lasers.

14. An optical module comprising:
    the optical transmitter module according to claim 13; and
    an optical receiver module.

15. An optical transmission equipment mounted with the optical module according to claim 14.

16. A method for controlling a submount which has amounting surface on which three or more semiconductor lasers are arranged in a first direction, and includes a heat generator configured to increase the temperatures of the three or more semiconductor lasers, the method comprising:
    causing a current with magnitude corresponding to an ambient temperature to flow through the heat generator where the ambient temperature is equal to or lower than a first temperature; and
    causing a current not to flow through the heat generator where the ambient temperature is higher than the first temperature,
    wherein, where the heat generator generates heat, a first heat of the heat absorbed by a first semiconductor laser of the three or more semiconductor lasers disposed at one end along the first direction is larger than a second heat of the heat absorbed by a second semiconductor laser of the three or more semiconductor lasers disposed to be adjacent to the first semiconductor laser on the mounting surface.

* * * * *